United States Patent

Geller et al.

[11] 4,306,225
[45] Dec. 15, 1981

[54] DIGITAL-TO-ANALOG CONVERTING APPARATUS

[75] Inventors: William L. Geller; Richard L. Naugle, both of Framingham, Mass.

[73] Assignee: GTE Laboratories Incorporated, Waltham, Mass.

[21] Appl. No.: 189,423

[22] Filed: Sep. 22, 1980

[51] Int. Cl.³ .................................... H03K 13/02
[52] U.S. Cl. ........................................ 340/347 DA
[58] Field of Search ... 340/347 DA, 347 M, 347 AD, 340/347 SY

[56] References Cited

U.S. PATENT DOCUMENTS

| | | | |
|---|---|---|---|
| 3,221,323 | 11/1965 | Beck | 340/347 DA |
| 3,273,143 | 9/1966 | Wasserman | 340/347 DA |
| 3,699,568 | 10/1972 | Thompson | 340/347 DA |
| 3,810,158 | 5/1974 | Murakami | 340/347 DA |
| 4,099,173 | 7/1978 | Zeskind | 340/347 AD |

OTHER PUBLICATIONS

Mokhoff "Electronics" May 10, 1979 pp. 105–116.
Hartley "Designer's Casebook" Prepared by the Editors of Electronics, no date, pp. 167–168 cited by applicant.

Primary Examiner—Charles D. Miller
Attorney, Agent, or Firm—David M. Keay

[57] ABSTRACT

A digital-to-analog converting apparatus having a plurality of stages arranged in a series. Each stage includes a latch for storing one of the bits of a digital input signal. Each stage includes a resistance, the resistances of the stages being connected in series. One end of the resistance in the first stage is connected to a reference voltage equal to the mid-point of the voltage range of the analog output signal to be produced. Constant current sources, of equal value in each stage, are connected to each end of the resistance and through a current switch to a constant current sink. The current switch is controlled by the outputs of the latch of the stage so that a constant current flows through the resistance in one direction or the other, increasing or decreasing the voltage applied to the next resistance in the series depending upon whether the stored bit is a logic 1 or a logic 0. The values of resistances and constant currents are selected so that the voltage drop across the resistance of each stage is one-half that of the previous stage. The output voltage produced at the end of the resistance of the last stage in the series is an analog voltage corresponding to the digital input signal applied to the latches.

8 Claims, 2 Drawing Figures

| DIGITAL INPUT | | | | LATCH STATES Q OUTPUTS | | | | NODE VOLTAGE (ΔV) | | | |
|---|---|---|---|---|---|---|---|---|---|---|---|
| D3 | D2 | D1 | D0 | 1 | 2 | 3 | 4 | $V_{N1}$ | $V_{N2}$ | $V_{N3}$ | $V_{N4}$ |
| 0 | 0 | 0 | 0 | L | L | L | L | 4 | 2 | 1 | $\frac{1}{2}$ |
| 0 | 0 | 0 | 1 | L | L | L | H | 4 | 2 | 1 | $1\frac{1}{2}$ |
| 0 | 0 | 1 | 0 | L | L | H | L | 4 | 2 | 3 | $2\frac{1}{2}$ |
| 0 | 0 | 1 | 1 | L | L | H | H | 4 | 2 | 3 | $3\frac{1}{2}$ |
| 0 | 1 | 0 | 0 | L | H | L | L | 4 | 6 | 5 | $4\frac{1}{2}$ |
| 0 | 1 | 0 | 1 | L | H | L | H | 4 | 6 | 5 | $5\frac{1}{2}$ |
| 0 | 1 | 1 | 0 | L | H | H | L | 4 | 6 | 7 | $6\frac{1}{2}$ |
| 0 | 1 | 1 | 1 | L | H | H | H | 4 | 6 | 7 | $7\frac{1}{2}$ |
| 1 | 0 | 0 | 0 | H | L | L | L | 12 | 10 | 9 | $8\frac{1}{2}$ |
| 1 | 0 | 0 | 1 | H | L | L | H | 12 | 10 | 9 | $9\frac{1}{2}$ |
| 1 | 0 | 1 | 0 | H | L | H | L | 12 | 10 | 11 | $10\frac{1}{2}$ |
| 1 | 0 | 1 | 1 | H | L | H | H | 12 | 10 | 11 | $11\frac{1}{2}$ |
| 1 | 1 | 0 | 0 | H | H | L | L | 12 | 14 | 13 | $12\frac{1}{2}$ |
| 1 | 1 | 0 | 1 | H | H | L | H | 12 | 14 | 13 | $13\frac{1}{2}$ |
| 1 | 1 | 1 | 0 | H | H | H | L | 12 | 14 | 15 | $14\frac{1}{2}$ |
| 1 | 1 | 1 | 1 | H | H | H | H | 12 | 14 | 15 | $15\frac{1}{2}$ |

Fig. 2.

DIGITAL-TO-ANALOG CONVERTING APPARATUS

CROSS-REFERENCE TO RELATED APPLICATION

This application is related to application Ser. No. 189,422 filed concurrently herewith by William L. Geller and Richard Naugle entitled "Analog-to-Digital Converting Apparatus" and assigned to the assignee of the present application.

BACKGROUND OF THE INVENTION

This invention relates to apparatus for converting digital signals to analog signals. More particularly, it is concerned with digital-to-analog converting apparatus employing successive approximation techniques.

Various types of digital-to-analog converting apparatus are well-known and widely used. Certain types provide very rapid operation of the conversion process but are relatively complicated and therefore relatively expensive.

SUMMARY OF THE INVENTION

Digital-to-analog converting apparatus in accordance with the present invention is relative simple and operates at reasonably high speed. The apparatus includes a plurality of N stages, equal to the number of digital input signal bits, arranged in series. Each stage includes a resistance means having a first and a second terminal. A source of reference voltage is connected to the first terminal of the resistance means of the first stage in the series, and an analog output connection is connected to the second terminal of the resistance means of the last stage in the series. The second terminal of each resistance means, except for the resistance means of the last stage in the series, is connected to the first terminal of the resistance means of the next stage in the series.

Each stage in the series includes first and second constant current means, a signal input terminal, data storage means, and a switching means. The first constant current means is connected to the first terminal of the associated resistance means and the second constant current means is connected to the second terminal of the associated resistance means. The first and second constant current means of each stage produce equal constant currents. The signal input terminal receives a bit of a digital input signal, the bit being of a first value or a second value. The data storage means of each stage is coupled to the associated signal input terminal and operates in a first condition in response to a bit of a first value and in a second condition in response to a bit of a second value. The switching means of each stage is coupled to the associated resistance means, first and second constant current means, and data storage means. A switching means is operable when the associated data storage means is in the first condition to provide a path for current from the associated first constant current means bypassing the associated resistance means, and to provide a path for current from the associated second constant current means flowing through the associated resistance means in the direction from the second terminal to the first terminal, whereby the voltage at the second terminal of the associated resistance means is greater than that at the first terminal by the voltage drop across the associated resistance means. The switching means is operable when the associated data storage means is in the second condition to provide a path for current from the second constant current means bypassing the associated resistance means, and to provide a path for current from the first constant current means flowing through the associated resistance means in the direction from the first terminal to the second terminal, whereby the voltage at the second terminal of the associated resistance means is less than that at the first terminal by the voltage drop across the associated resistance mean. Thus, the resulting voltage produced at the analog output connection is an analog output voltage of amplitude corresponding to the bits of the digital input signal at the signal input terminals.

BRIEF DESCRIPTION OF THE DRAWINGS

In the drawings:

FIG. 2 is a table useful in explaining the operation of the apparatus of FIG. 1.

Figure 1:
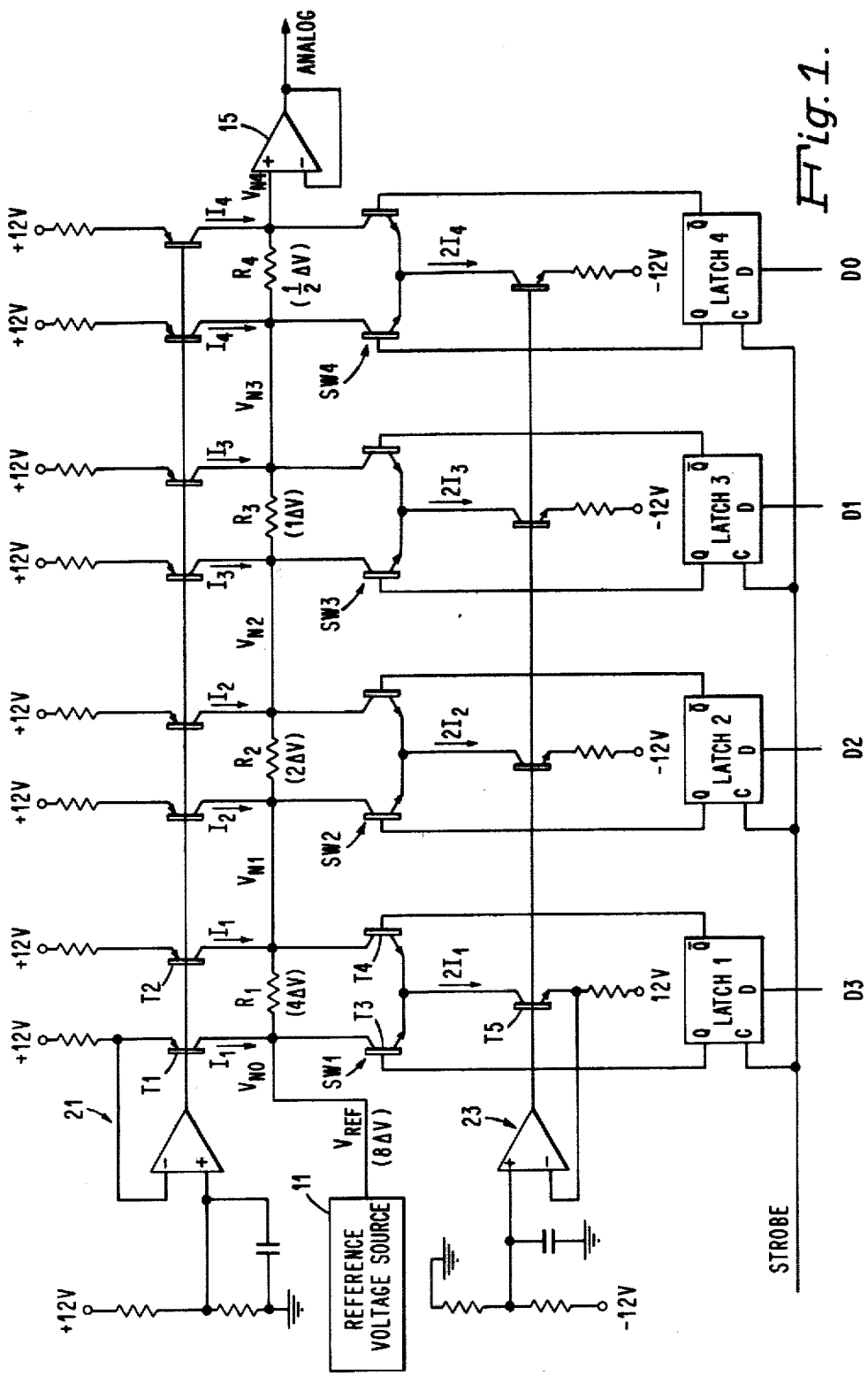
FIG. 1 is a schematic circuit diagram of a digital-to-analog converting apparatus in accordance with the present invention.

For a better understanding of the present invention, together with other and further objects, advantages, and capabilities thereof, reference is made to the following disclosure and appended claims in connection with the above-described drawings.

DETAILED DESCRIPTION OF THE INVENTION

FIG. 1 is a schematic circuit diagram of an exemplary digital-to-analog converter in accordance with the present invention for converting a four-bit digital input signal to a corresponding analog output voltage. The apparatus as shown has four stages arranged in series, a stage for each bit of the digital input signal. Each stage includes a latch, latch 1-4, which may be a D-type flip-flop. The D input of each latch is the input terminal for receiving a digital signal input bit D3–D0, respectively, D3 being the most significant bit and D0 being the least significant bit. The latches are latched to accept and store an input bit by periodically occurring STROBE pulses.

Each stage includes a resistance $R_1$–$R_4$ connected in series. The first terminal of resistance $R_1$ of the first stage is connected to a reference voltage source 11 which produces a reference voltage $V_{REF}$. The second terminal of each resistance in the series is connected to the first terminal of the next resistance in the series except for the fourth and last stage. The second terminal of resistance $R_4$ of the fourth stage is connected to a circuit arrangement 15 of an operational amplifier providing a unity gain amplifier which serves as a buffer isolating the apparatus from subsequent circuitry. For purposes of explaining the operation of the illustrated apparatus points along the series of resistances $R_1$–$R_4$ between the reference voltage source 11 and the output buffer 15 are labeled as voltage nodes VN0–VN4. The output of the buffer 15, labeled ANALOG, is at the same voltage as node VN4, the second terminal of the last resistance in the series.

Two constant current sources including transistors T1 and T2 are connected to the first and second terminals, respectively, of the resistance $R_1$ of the first stage. Current flow through the transistors is controlled by a conventional arrangement 21. Equal constant currents $I_1$ flow through each transistor T1 and T2. Transistors T1 and T2 are connected directly to transistors T3 and T4, respectively, of a transistor switching arrangement SW1 which is controlled by the outputs Q and $\overline{Q}$ of the latch, latch 1. The currents through transistors T3 and T4 are combined to a current $2I_1$ which passes through a constant current sink including transistor T5 and controlled by a conventional arrangement 23.

The second stage which includes latch 2 and resistance $R_2$ also includes two constant current sources which produce equal constant currents $I_2$, a transistor switching arrangement SW2, and a constant current sink for a constant current of $2I_2$. The third stage includes a similar circuit arrangement of latch 3, resistance $R_3$, two constant current sources producing equal currents $I_3$, a transistor switching arrangement SW3, and a constant current sink for a constant current of $2I_3$. Similarly the fourth stage includes latch 4, resistance $R_4$, two constant current sources producing equal currents $I_4$, a transistor switching arrangement SW4, and a constant current sink for a constant current of $2I_4$.

The first stage operates in the following manner when a logic 1 input bit D3 is stored in latch 1. The Q output of latch 1 is high and the $\overline{Q}$ output is low. Thus, transistor T3 of the transistor switch SW1 is biased to a low impedance condition and transistor T4 is biased to a high impedance condition. Under these conditions the constant current $I_1$ flowing through constant current transistor T1 flows directly through switching transistor T3 and does not pass through resistance $R_1$. The constant current $I_1$ flowing through constant current transistor T2 flows through resistance $R_1$ and switching transistor T3. The combined current $2I_1$ from transistor T3 flows through the constant current sink transistor T5. By virtue of the flow of constant current $I_1$ in the direction from node VN1 to VN0, the voltage at node VN1 is greater than the reference voltage $V_{REF}$ at node VN0 by the voltage drop $I_1R_1$ across the resistance $R_1$.

When a logic 0 is stored in latch 1, the Q output is low and the $\overline{Q}$ output is high. These output conditions bias switching transistor T3 of the transistor switch SW1 to a high impedance condition and switching transistor T4 to a low impedance condition. The constant currents $I_1$ from both constant current transistors T1 and T2 flow through switching transistor T4. The current from transistor T1 flows through resistance $R_1$ while that from transistor T2 bypasses resistance $R_1$. Since the current $I_1$ flows in the direction from node VN0 to node VN1, the voltage at node VN1 is lower than the reference voltage $V_{REF}$ at node VN0 by the voltage drop $I_1R_1$ across resistance $R_1$.

The exemplary apparatus illustrated in FIG. 1 converts a four-bit digital input signal, D3-D0, to an ANALOG signal at one of sixteen possible voltage levels. It may be considered that there are sixteen voltage steps $\Delta V$ over the full range of ANALOG output voltages to be produced. In general, for apparatus having N digital inputs and N stages the total number of voltage steps over the full range of output voltages is $2^N$, or the full voltage range equals $2^N \Delta V$. The reference voltage $V_{REF}$ is equal to the mid-point of the ANALOG signal voltage range. Assuming the minimum ANALOG voltage to be zero, the reference voltage $V_{REF}$ may be expressed as $2^N \Delta V/2$, which in the present specific embodiment is $8 \Delta V$.

The values of constant current $I_1$ and resistance $R_1$ are selected so that the voltage drop $I_1R_1$ across resistance $R_1$ is equal to one-quarter of the full range of ANALOG output voltages, specifically $4 \Delta V$. The values of constant current $I_2$ and resistance R2 are selected so that the voltage drop $I_2R_2$ across resistance $R_2$ is one-eighth of the full range of ANALOG output voltages, specifically $2 \Delta V$. Constant current $I_2$ and resistance $R_3$ of one-sixteenth of the full range of ANALOG output voltages, specifically $1 \Delta V$, and constant current $I_4$ and resistance $R_4$ are selected to provide a voltage drop $I_4R_4$ across resistance $R_4$ of one-thirty second of the full range of ANALOG output voltages, specifically $\frac{1}{2} \Delta V$. Thus, the voltage drop $I_nR_n$ across the resistance $R_n$ of a stage in the series, where n is the numerical position of the stage in the series of N stages, may be expressed as $2^N \Delta V / 2^{n+1}$.

FIG. 2 is a table indicating operating conditions at various points within the apparatus of FIG. 1 in response to each of the possible digital input signals. The first portion 31 is a table of the possible bits of the digital input signal at the input terminals D3-D0. The second portion 32 illustrates the resulting Q outputs of each of the latches (H indicating high and L indicating low). The $\overline{Q}$ output is the opposite of the Q output. The third portion 33 indicates the resulting voltage in units of $\Delta V$ at the voltage nodes VN1-VN4. The ANALOG output of the buffer 15 is the same as voltage node VN4.

The value of the input bit D3 stored in latch 1 on a STROBE pulse produces Q and $\overline{Q}$ outputs which control conduction through transistors T3 and T4 of the transistor switch SW1. If the input bit D3 is a logic 1, the Q output of latch 1 is high and the $\overline{Q}$ output is low. Transistor T3 is biased to conduction and current $I_1$ from transistor T2 flows through resistance $R_1$ thereby increasing the voltage at node VN1 over that at node VN0 by $4 \Delta V$ to $12 \Delta V$, as illustrated in FIG. 2. If the input bit D3 is a logic 0, the Q output of latch 1 is low and the $\overline{Q}$ output is high. Switching transistor T4 conducts and current $I_1$ from transistor T1 flows through resistance $R_1$ decreasing the voltage at node VN1 over that at node VN0 by $4 \Delta V$ to $4 \Delta V$, as illustrated in FIG. 2.

Latch 2 stores digital input bit D2 on the STROBE pulse. Depending upon whether bit D2 is a logic 1 or a logic 0 one of the two transistors of the switching arrangement SW2 conducts and the other does not conduct determining the direction that current $I_2$ flows through resistance $R_2$. Depending upon the direction of current flow, the $I_2R_2$ voltage drop produces a voltage at node VN2 which is either greater than or less than that at node VN1 by $2 \Delta V$. The various possible voltages present at node VN2 are illustrated in the third portion 33 of FIG. 2.

In the third stage the digital input bit D1 causes latch 3 to control conduction in the transistors of the switching arrangement SW3. The various possibilities of resulting voltage produced at node VN3 by the polarity of the $I_3R_3$ voltage drop of $1 \Delta V$ across resistance $R_3$ are indicated in FIG. 2. Similarly the logic level of the fourth input bit D0 determines the output conditions of latch 4 and consequently which transistor of switching arrangement SW4 conducts and which does not conduct thereby determining the direction of current $I_4$ flowing through resistance $R_4$. The various possibilities produced at the voltage node VN4 by the direction of current flow producing the $I_4R_4$ voltage drop of $\frac{1}{2} \Delta V$ across resistance $R_4$ are indicated in FIG. 2.

In the apparatus illustrated in FIG. 1 the voltage at voltage node VN4 is applied to a unity gain amplifier 15 which produces an ANALOG voltage equal to that at voltage node VN4. The ANALOG voltage produced is accurate to within $\frac{1}{2} \Delta V$. The ANALOG voltage may be applied to a suitable filtering arrangement so that a train of ANALOG voltages produced in response to periodic STROBE pulses is formed into a smooth continuous curve.

The apparatus as described readily may be expanded to any number of stages N for any number of digital input signal bits N to provide resolution of the analog output signal into $2^N$ voltage steps. The combination of values of constant currents and resistances as described provide a linear conversion of binary digital signals to analog voltages. By appropriate selection of these parameters a non-linear, for example logarithmic, relationship could be provided between the digital and analog signals.

A digital-to-analog converting apparatus in accordance with the invention produces a total delay for each conversion which depends only on the sum of the delays for the N stages. The use of two constant current sources and a constant current sink of value equal to the sum of the two sources in each of the stages assures that there is no current flow between stages. The current in each stage, therefore, neither adds to nor subtracts from currents in other stages, thus preventing any adverse effects on the voltages at the voltage nodes. The unity gain buffer amplifier 15 prevents current flow into or out of the apparatus shown from subsequent circuitry.

While there has been shown and described what is considered to be a preferred embodiment of the present invention, it will be obvious to those skilled in the art that various changes and modifications may be made therein without departing from the invention as defined by the appended claims.

What is claimed is:

1. Apparatus for converting a digital signal to an analog signal including in combination
   a plurality of N stages arranged in series, each stage including a resistance means having a first and a second terminal;
   a source of reference voltage connected to the first terminal of the resistance means of the first stage in the series;
   an analog output connection connected to the second terminal of the resistance means of the last stage in the series;
   the second terminal of each resistance means, except for the resistance means of the last stage in the series, being connected to the first terminal of the resistance means of the next stage in the series;
   each stage including
      first constant current means for producing a constant current connected to the first terminal of the associated resistance means;
      second constant current means for producing a constant current equal to the constant current produced by the associated first constant current means connected to the second terminal of the associated resistance means;
      a signal input terminal for receiving a bit of a digital input signal, the bit being of a first or a second value;
      data storage means coupled to said signal input terminal and operable in a first condition in response to a bit of a first value and operable in a second condition in response to a bit of a second value;
      switching means coupled to the associated resistance means, the associated first and second constant current means, and the associated data storage means;
      the switching means being operable when the associated data storage means is in the first condition to provide a path for current from the first constant current means bypassing the associated resistance means, and to provide a path for current from the second constant current means flowing through the associated resistance means in the direction from the second terminal to the first terminal, whereby the voltage at the second terminal of the associated resistance means is greater than that at the first terminal by the voltage drop across the associated resistance means; and
      the switching means being operable when the associated data storage means is in the second condition to provide a path for current from the second constant current means bypassing the associated resistance means, and to provide a path for current from the first constant current means flowing through the associated resistance means in the direction from the first terminal to the second terminal, whereby the voltage at the second terminal of the associated resistance means is less than that at the first terminal by the voltage drop across the associated resistance means;
   whereby the voltage produced at the analog output connection is an analog output voltage of amplitude corresponding to the bits of the digital input signal at the signal input terminals.

2. Apparatus in accordance with claim 1 wherein
   the source of reference voltage produces a voltage equal to the mid-point of the voltage range of analog output voltages to be produced; and
   the voltage drop across each resistance means produced by current flow from an associated constant current means is equal to the voltage range of analog output voltages to be produced divided by $2^{n+1}$ where n is the numerical position of the associated stage in the series.

3. Apparatus in accordance with claim 2 wherein each of said switching means includes
   a first switching device connected to the first terminal of the associated resistance means, said first switching device being operable to provide a low impedance to current flow therethrough when the associated data storage means is in the first condition, and being operable to provide a high impedance to current flow therethrough when the associated data storage means is in the second condition; and
   a second switching device connected to the second terminal of the associated resistance means, said second switching device being operable to provide a high impedance to current flow therethrough when the associated data storage means is in the first condition, and being operable to provide a low impedance to current flow therethrough when the associated data storage means is in the second condition.

4. Apparatus in accordance with claim 3 wherein each of said data storage means is operable to be switched to said first condition in response to a control signal being applied thereto when a bit of a first value is being received at said signal input terminal, and is operable to be switched to said second condition in response to a control signal being applied thereto when a bit of a second value is being received at said signal input terminal;

and including
means for periodically applying a control signal to all of said data storage means.

5. Apparatus in accordance with claim 1 wherein
each of said data storage means has a first and a second output connection, said data storage means being operable to produce a first output signal at its first output connection and a second output signal at its second output connection when in said first condition, and being operable to produce a second output signal at its first output connection and a first output signal at its second output connection when in said second condition; and
each of said switching means includes
a first switching device connected to the first terminal of the associated resistance means and the first output connection of the associated data storage means, said first switching device being operable to provide a low impedance to current flow therethrough when the associated data storage means is producing said first output signal at its first output connection, and being operable to provide a high impedance to current flow therethrough when the associated data storage means is producing said second output signal at its first output connection; and
a second switching device connected to the second terminal of the associated resistance means and the second output connection of the associated data storage means, said second switching device being operable to provide a low impedance to current flow therethrough when the associated data storage means is producing said first output signal at its second output connection, and being operable to provide a high impedance to current flow therethrough when the associated data storage means is producing said second output signal at its second output connection.

6. Apparatus in accordance with claim 5 wherein
each of said stages includes
a first constant current source means connected to the first terminal of the associated resistance means;
a second constant current source means connected to the second terminal of the associated resistance means; and
a constant current sink means connected to the first and second switching devices;
the current flow from the first constant source means being equal to the current flow from the associated second constant current source means, and the current flow to the associated constant current sink means being equal to the total of the current flow from the associated first and second constant current source means.

7. Apparatus in accordance with claim 6 wherein
each of said data storage means is operable to be switched to said first condition in response to a control signal being applied thereto when a bit of a first value is being received at said signal input terminal, and is operable to be switched to said second condition in response to a control signal being applied thereto when a bit of a second value is being received at said signal input terminal;
and including
means for periodically applying a control signal to all of said data storage means.

8. Apparatus in accordance with claim 7 wherein
the source of reference voltage produces a voltage equal to the mid-point of the voltage range of analog output voltages to be produced; and
the voltage drop across each resistance means produced by current flow from an associated constant current means is equal to the voltage range of analog output voltages to be produced divided by $2^{n+1}$ where n is the numerical position of the associated stage in the series.

* * * * *